(12) United States Patent
Lim et al.

(10) Patent No.: US 6,350,661 B2
(45) Date of Patent: Feb. 26, 2002

(54) SILICON NITRIDE CAPPED SHALLOW TRENCH ISOLATION METHOD FOR FABRICATING SUB-MICRON DEVICES WITH BORDERLESS CONTACTS

(75) Inventors: Chong Wee Lim, Misia (MY); Eng Hua Lim, Singapore (SG); Soh Yun Siah, Singapore (SG); Kong Hean Lee, Singapore (SG); Chun Hui Low, Misia (MY)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/882,682

(22) Filed: Jun. 18, 2001

Related U.S. Application Data

(62) Division of application No. 09/351,240, filed on Jul. 12, 1999, now Pat. No. 6,297,126.

(51) Int. Cl.$^7$ ................................................ H01L 21/76
(52) U.S. Cl. ........................ 438/424; 438/221; 438/296
(58) Field of Search ................................ 438/424, 425, 438/426, 427, 221, 296

(56) References Cited

U.S. PATENT DOCUMENTS

| | | |
|---|---|---|
| 5,268,330 A | 12/1993 | Givens et al. |
| 5,652,176 A | 6/1997 | Maniar et al. |
| 5,677,231 A | 10/1997 | Maniar et al. |
| 5,804,490 A | 9/1998 | Fiegl et al. .............. 438/424 |
| 5,807,784 A | 9/1998 | Kim .......................... 438/423 |
| 5,817,568 A | 10/1998 | Chao ......................... 438/427 |
| 6,051,479 A * | 4/2000 | Hong ......................... 438/425 |
| 6,133,105 A * | 10/2000 | Chen et al. ................ 438/296 |
| 6,204,185 B1 * | 3/2001 | Hsu .......................... 438/692 |

* cited by examiner

Primary Examiner—Tuan H. Nguyen
(74) Attorney, Agent, or Firm—George O. Saile; Rosemary L. S. Pike

(57) ABSTRACT

An improved and new process for fabricating MOSFET's in shallow trench isolation (STI), with sub-quarter micron ground rules, includes a passivating trench cap layer of silicon nitride. The silicon nitride passivating trench cap is utilized in the formation of borderless or "unframed" electrical contacts, without reducing the poly to poly spacing. Borderless contacts are formed, wherein contact openings are etched in an interlevel dielectric (ILD) layer over both an active region (P-N junction) and an inactive trench isolation region. During the contact hole opening, a selective etch process is utilized which etches the ILD layer, while the protecting passivating silicon nitride trench cap layer remains intact protecting the P-N junction at the edge of trench region. Subsequent processing of conductive tungsten metal plugs are prevented from shorting by the passivating trench cap. This method of forming borderless contacts with a passivating trench cap in a partially recessed trench isolation scheme improves device reliability since it prevents electrically short circuiting of the P-N junction and lowers the overall diode leakage. Furthermore, the use of the silicon nitride trench cap protects the underlying STI trench oxide during subsequent cleaning process steps. In addition, the nitride cap protects the STI oxide from excessive recess formation and prevents the exposure of STI seams, in addition to minimizing transistor junction leakage.

5 Claims, 2 Drawing Sheets

SILICON NITRIDE CAPPED SHALLOW TRENCH ISOLATION METHOD FOR FABRICATING SUB-MICRON DEVICES WITH BORDERLESS CONTACTS

RELATED PATENT APPLICATION

This is a division of patent application Ser. No. 09/351,240, filing date Jul. 12, 1999, now U.S. Pat. No. 6,297,126 A Silicon Nitride Capped Shallow Trench Isolation Method For Fabricating Sub-Micron Devices With Borderless Contacts, assigned to the same assignee as the present invention.

This application is related to Ser. No. 09/351,238 with Filing Date Jul. 12, 1999, assigned to a common assignee.

BACKGROUND OF THE INVENTION (1) Field of the Invention

It is a general object of the present invention to provide a new and improved method of forming an integrated circuit utilizing a partially recessed shallow trench isolation (STI) scheme, in conjunction with a passivating, silicon nitride cap, to fabricate borderless contacts.

In sub-micron technology shallow trench isolation (STI) has become a standard means of isolation for semiconductor devices and has replaced other isolation methods, i.e., LOCOS (Localized Oxidation of Silicon) which require more valuable area. In the conventional shallow trench isolation process, trenches are formed in a semiconductor substrate between electrically active areas, i.e., MOSFET gates and source/drains, and electrically isolate MOSFET's from each other. The trenches are filled with an insulating material, such as silicon oxide, to provide electrical insulation. Active devices, including MOSFET's, transistors and resistors are fabricated into the semiconductor substrate in the "active" regions with shallow trench isolation (STI), isolating the regions in between the active devices.

As transistor dimensions approached sub-micron, the conventional contact structures in use started to limit the device performance in several ways. First, it is difficult to minimize the contact resistance if the contact hole was is also of minimum size and problems with cleaning small contact holes become a concern. In addition, with defined conventional contacts, the area of the source/drain regions cannot be minimized because the contact hole has be aligned to these regions with a separate masking step, and a large "extra" area has to be allocated for possible misalignment. Furthermore, this larger "extra" area also results in increased source/drain-to-substrate junction capacitance, which impacts device speed. Borderless contacts or "unframed" contacts solve many of the micron and sub-micron MOSFET contact problems, easing both the device ground rule designs and easing the processing problems associated with conventional "framed" contacts. The borderless contact makes better use of the space and area over the source/drain region, as will be described in more detail. Borderless contacts are part of the advanced designs and processing associated with shallow trench isolation (STI).

(2) Description of Related Art

With conventional shallow trench isolation (STI) processes, it is a problem to form a borderless contact over the trench region. The borderless contact or "unframed" contact is a contact which overlies and exposes both the active and isolation regions of the semiconductor substrate, usually for the purpose of making contact to a diffusion region formed in the substrate. One problem of forming borderless contacts in combination with conventional shallow trench isolation (STI) involves the etching of the contact hole opening through interlevel layers of dielectrics, while at the same time, trying to avoid etching the dielectric material in trench. Oftentimes, the dielectrics are types of silicon oxide, both for the interlevel and trench fill material. Therefore, the trench filled oxide can be etched and damaged due to the contact hole etch. If the trench isolation material is etched back along the wall of the trench, deleterious effects can occur, i.e., leakage and shorting at the edge of the P/N junction, especially when this region becomes filled with a conducting material.

U.S. Pat. No. 5,807,784 entitled "Device Isolation Methods for a Semiconductor Device" granted Sep. 15, 1998 to Kim describes a method of forming a device isolation layer in semiconductor device comprising of a two step method of forming field oxide in shallow trench isolation (STI). The first step consists of implanting oxygen ions into the bottom of trench in the field region of a semiconductor substrate, and oxidizing the oxygen implanted region to form a field oxide layer. The second step consists of depositing insulation material to further fill the trench.

U.S. Pat. No. 5,807,490 entitled "METHOD OF FILLING SHALLOW TRENCHES" granted Sep. 8, 1998 to Fiegl et al shows a method of isolation in silicon integrated circuit processing which overfills the trench by a fill margin and then deposits a temporary layer of polysilicon having a thickness less than the trench depth. A oxide layer is used as a polishing stop. Th e temporary layer is polished outside the trench, using a fill layer and polishing stop layer as polishing stops for chemical mechanical polish (CMP). The polishing stop layer is removed by CMP, together with the same thickness of fill planarity. The remaining temporary layer is stripped and a final touch up polish of the fill layer stops on the pad nitride.

U.S. Pat. No. 5,817,568 entitled "Method of Forming a Trench Isolation Region" granted Oct. 6, 1998 to Chao describes a method, using multi-trench formation techniques, to define the respective depths of trenches having different widths. The method includes forming a buffer oxide layer and polishing stop layer, in sequence, above a semiconductor substrate. Then, the buffer oxide layer, the polishing stop layer and the semiconductor substrate are defined to form at least one narrow trench. Thereafter, the buffer oxide layer, the polishing stop layer and the semiconductor substrate are again defined to form at least one wide trench. Next, a portion of the oxide layer and a portion of the polishing stop layer are removed to form a planarized surface. Finally, the polishing stop layer and the buffer oxide layer are removed.

U.S. Pat. No. 5,652,176 entitled "Method for Providing Trench Isolation and Borderless Contact" granted Jul. 29, 1997 to Maniar et al describes a method of trench isolation which uses a trench liner comprised of aluminum nitride. Another similar patent is U.S. Pat. No. 5,677,231 entitled "Method for Providing Trench Isolation" granted Oct. 14, 1997 to Maniar et al also shows shallow trench isolation (STI) and a borderless contact process with an aluminum nitride liner under the STI silicon oxide. During the formation of the contact opening, using etch chemistry which is selective to aluminum nitride, the trench liner protects a P-N junction at the corner of the trench. By protecting the junction, subsequent formation of a conductive plug will not electrically short circuit the junction, and keeps diode leakage low.

U.S. Pat. No. 5,268,330 entitled "Process for Improving Shee Resistance of an Integrated Circuit Device Gate"

granted Dec. 7, 1993 to Givens et al describes a process involving shallow trench isolation (STI) and contact above P-N junctions that can be made to be borderless contacts. A passivating layer is deposited over an integrated circuit device, fabricated using silicidation. An insulating layer is deposited. The insulating layer is planarized and further polished to expose the passivating layer above the gate. The portion of passivating layer above the gate is removed. A trench above the junctions is formed by removing insulation and using the passivating layer as an etch stop. Then a portion of the passivating layer is removed above the junction. The gate can be further silicided and opening above the gate and trench can be filled. The contacts above the junction can be borderless contacts.

SUMMARY OF THE INVENTION

It is a general object of the present invention to provide a new and improved method of forming an integrated circuit utilizing a partially recessed shallow trench isolation (STI) scheme, in conjunction with a passivating, silicon nitride cap, to fabricate borderless contacts.

A more specific object of the present invention is to provide an improved method of forming borderless contacts in the fabrication of integrated circuits on semiconductor substrates, which are typically single crystal silicon. The initial processes involves conventional formation of a pad oxide layer, which is formed by thermally growing a silicon dioxide layer. A "hard mask" layer of silicon nitride is then deposited. A shallow trench for shallow trench isolation (STI) is patterned, as well as, the layers of hard mask nitride and pad oxide, all using a reverse mask process. A shallow trench is etched followed by the deposition of a thick layer of silicon oxide. The thick oxide layer forms a slight dip in the surface over the trench caused by the trench filling process. The surface is planarized, polishing the thick oxide layer back by chemical mechanical polish (CMP), so as to be nearly planar with the hard mask nitride layer. The hard mask nitride layer acts as a polishing stop.

In a first embodiment of the present invention, the above and other objectives are realized by using a method of fabricating a partially recessed shallow trench isolation (STI) structure, as described by the following method. After the planarization of the trench described above, a partial silicon oxide etch back is initiated either by using a dry etch process, or a wet etch process. The end result of the partial etch back step is to etch the oxide in the trench back to approximately halfway to three-quarters of the way down into the trench. More details for the partial etch back process of this present invention can be found in the "DESCRIPTION OF THE PREFERRED EMBODIMENTS" section.

In a second embodiment of the present invention, the above and other objectives are realized by using a method of fabricating a borderless contact, which consists of silicon nitride cap protection layer on top of a partially recessed trench oxide. This passivating nitride cap is accomplished in this invention by the following method. After the partial etch back of the trench oxide mentioned above, and removal of the hard mask, only a partially recessed oxide remains in the shallow trench. At this step in the process, a key process step in this invention is the formation of a silicon nitride cap layer in the trench. Therefore, after the partial STI oxide etch back and hard mask removal, a thick layer of silicon nitride is deposited by either a low pressure chemical vapor deposition (LPCVD) system or by a high density plasma (HDP) system and is performed, in such a manner, as to form a seamless STI nitride trench fill. Following the thick LPCVD or HDP nitride cap deposition, the surface is planarized by chemical mechanical polish (CMP) and the polish back process is stopped above the plane of trench opening and above the pad oxide layer, stopping well within the nitride cap layer. Thus, the pad oxide layer continues to remains in place. Next, the nitride cap layer is shaped and formed by partially removing the nitride layer by etching back to just below the pad oxide level. The process of partially etching back the nitride layer, places the silicon nitride cap in final form over the partially recessed STI oxide, acting a protecting passivating layer.

In a third embodiment of the present invention, the above and other objectives are realized by using a method of fabricating a borderless or "unframed" contact to substrate diffusion regions by taking advantage of the nitride cap, which is self-aligned and acts a protective passivating layer. Utilizing the nitride cap in a partially recessed oxide process, this method of contact hole formation and alignment has several advantages that will be described. The key point is that the silicon nitride cap is self-aligned and acts as a protective passivation layer in the region of the diffusions and the edge of the shallow trench isolation. One key advantage to the nitride cap is it forms a borderless contact without reducing the polysilicon to polysilicon spacing, a key design advantage. In addition, the nitride cap protects the shallow trench isolation edge, near the edge of the junction, from both contact hole mis-alignment and also from the salicide formation process. The nitride cap also electrically insulates the trench isolation edges and minimizes field edge intensive electrical leakage.

Another object of the present invention is to provide an improved method of forming trench fill. The partially recessed oxide, in the twofold STI fill process, oxide then nitride, described earlier, helps to fill trenches with high aspect ratios and helps to eliminate the STI seams and voids.

Convention processing steps that are employed in this invention to fabricate devices are stated as follows. Prior to the tungsten contact or plug/stud formation, several standard processes are performed: (a) polysilicon deposition, doping, anneal and patterning to form ploy gates (not shown in Figs.), (b) titanium silicide formation processes, (c) USG undoped silicate glass formation processes, (d) SACVD BPSG, sub-atmospheric chemical vapor deposition of boro phosphosilicate glass formation processes, (e) PE TEOS plasma enhanced TEOS tetraethylortho silicate deposited oxide (not shown in Figs.) for planarization of the surface. Included are all the standard processes associated with providing these layers, which form an interlevel dielectric layer (ILD). Contact holes are defined and etched followed by CVD tungsten depositing. Tungsten plug/stud formation results, and misalignment of the contact holes is taken care of by the nitride cap in this invention, which is both protective and passivating.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The main embodiment of this invention is a new and improved method of using a silicon nitride capped shallow trench isolation (STI) method for fabricating sub-micron devices in a unique process scheme to fabricate borderless contacts.

Figure 1:
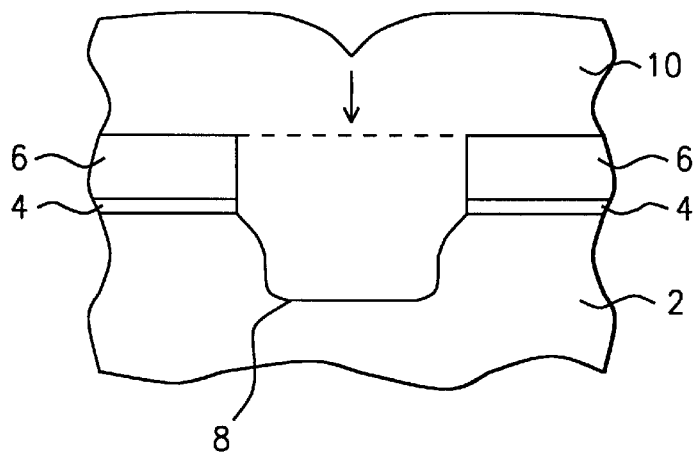
FIG. 1, which in cross-sectional representation illustrates the method of shallow trench isolation (STI) with hard mask, pad oxide and thick oxide blanket deposition.

Referring to FIG. 1, a semiconductor substrate 2 is provided, and typically is a single crystal silicon substrate. A pad oxide layer 4 is formed by thermally growing a silicon dioxide layer. A hard mask layer 6 of silicon nitride is deposited. A shallow trench 8 is patterned and the layers of hard mask nitride and pad oxide are patterned, all using a reverse mask process. A shallow trench is etched and then a thick layer of silicon oxide 10 is deposited with a slight dip in the surface caused by the trench filling process.

This thick layer of silicon oxide shown in FIG. 1, is deposited under the following detailed process conditions, by chemical vapor deposition (CVD). The targeted film thickness is from about 5,000 to 10,000 Angstroms. The deposition temperature is in a broad range from about 400 to 800° C. Reactive gases are silane ($SiH_4$), oxygen ($O_2$), ozone ($O_3$), and dichlorosilane ($SiH_2Cl_2$).

Figure 2:
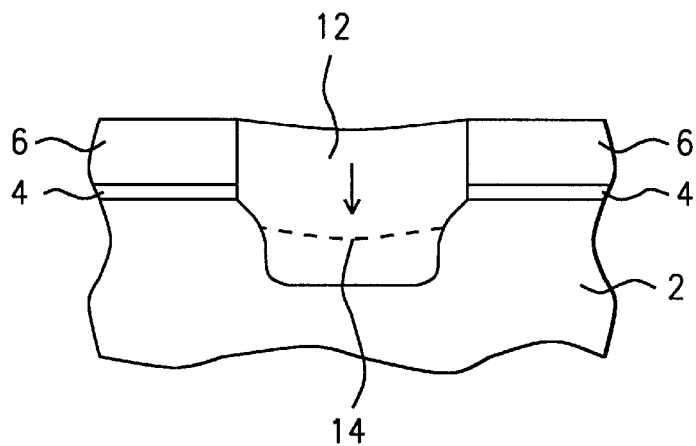
FIG. 2, which in cross-sectional representation illustrates the method of planarization by chemical mechanical polish (CMP) of the surface.

Referring to FIG. 2, the thick oxide layer 12 is polished back by chemical mechanical polish (CMP) and is shown in FIG. 2 to be nearly planar with the hard mask 6 nitride layer, which acts as a polishing stop layer. At this point in the process, a partial silicon oxide etch back step is initiated, using either a dry etch proces, or a wet etch process. The end result of the partial etch back step is to etch the oxide in the trench back to approximately the dotted line 14, sketched in FIG. 2.

The oxide etch back process shown in FIG. 2 forming a partially recessed trench, is etched under the following detailed process conditions. For the dry etch back process by plasma etching, the chamber pressure is from about 5 to 50 milliTorr, temperature from about 80 to 200° C., power from about 1,000 to 2,000 Watts. The etch rate is from about 3,000 to 6,000 Angstroms/min, with a targeted etch removal from about 5,000 to 10,000 Angstroms. The reactive gases used are: $CF_4$, $CHF_3$, $SiF_4$, $C_4F_8$, Ar, $O_2$. For the wet etch back process, dilute hydrofluoric acid (DHF) is used to removed from about 2,000 to 4,000 Angstroms and the targeted oxide thickness remaining in the trench is from about 1,500 to 2,500 Angstroms.

Figure 3:
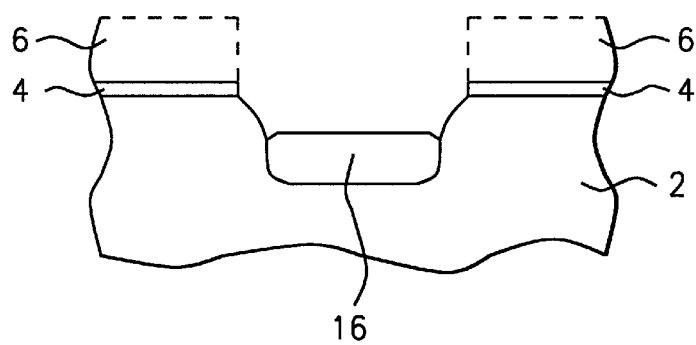
FIG. 3, which in cross-sectional representation illustrates the method of an embodiment of the present invention, whereby a partially recessed trench isolation is formed and the thick hard mask layer is removed (dotted lines) leaving the oxide pad in place.

Referring to FIG. 3, after the partial etch back, only a partial recess oxide 16 for STI remains. In addition to the partial removal of the isolation oxide, the silicon nitride hard mask layer 6 (indicated by the dotted lines) is removal by preferential selective etching. The hard mask is etched by using an aqueous mixture of sulfuric acid and hydrogen peroxide solution. Note that the shallow trench isolation (STI) undergoes a reduction in aspect ratio. The pad oxide layer 4 remains in place, as sketched in FIG. 3.

Figure 4:
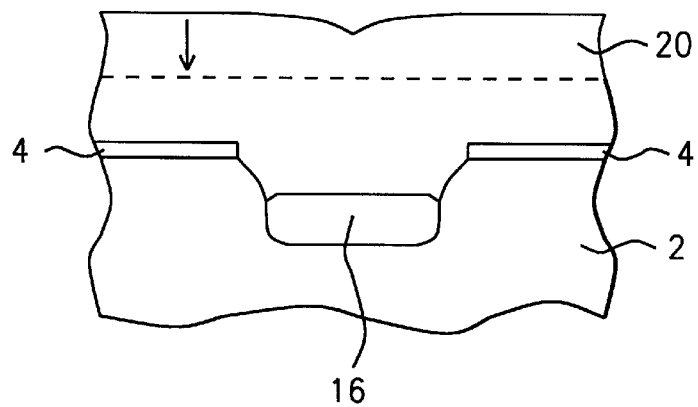
FIG. 4, which in cross-sectional representation illustrates the method of an embodiment of the present invention, whereby a thick nitride layer is deposited, the surface planarized by chemical mechanical polish (CMP) to the process steps is formed into a passivating trench cap, for borderless or "unframed" contact hole formation.

Referring to FIG. 4, after the partial STI etch back, a thick layer of silicon nitride 20 is deposited by either a high density plasma (HDP) system or by a low pressure chemical deposition system (LPCVD), and is performed, in such a manner, as to form a seamless STI trench fill. The thick silicon nitride layer, to be the trench cap layer, can either be formed in a vertical furnace (LPCVD) or in a high density plasma HDP CVD chamber. Reactant gases are: silane, ammonia, nitrous oxide, and dichlorosilane. The targeted film thickness is from about 1,000 to 5,000 Angstroms.

Still referring to FIG. 4, after the thick nitride 20 is deposited, the surface is planarized by chemical mechanical polish (CMP) and the polish back process is stopped in the region outlined by the dotted line, still within the nitride layer 20. The pad oxide layer 4 continues to remains in place.

Figure 5:
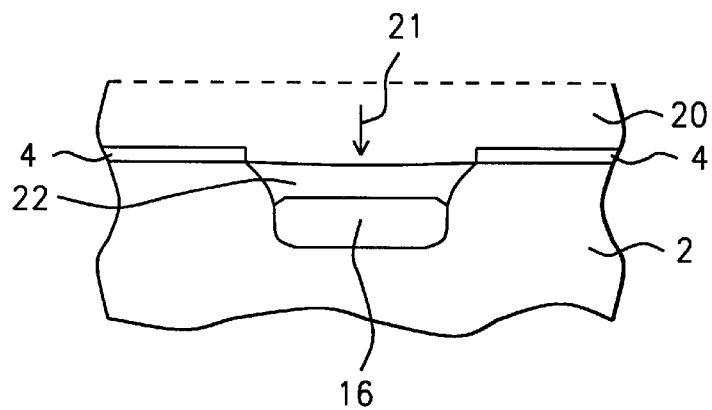
FIG. 5, which in cross-sectional representation illustrates the method of an embodiment of the present invention, whereby the blanket nitride etched back to form a passivating STI cap, for borderless contacts.

Referring to FIG. 5, after the surface planarization by chemical mechanical polish, the nitride layer 20 is partially removed by etching back to just below the pad oxide 4 level. Note the dotted line in FIG. 5 indicating the original nitride planar surface 20 and the arrow 21 indicating the etch back level. The process of partially etching back the nitride forms a nitride cap 22 over the STI oxide 16. The selective, preferential etch back conditions for said nitride are: can be either dry or wet etch, with the remaining nitride cap layer thickness being between approximately from 500 to about 3,000 Angstroms.

Figure 6:
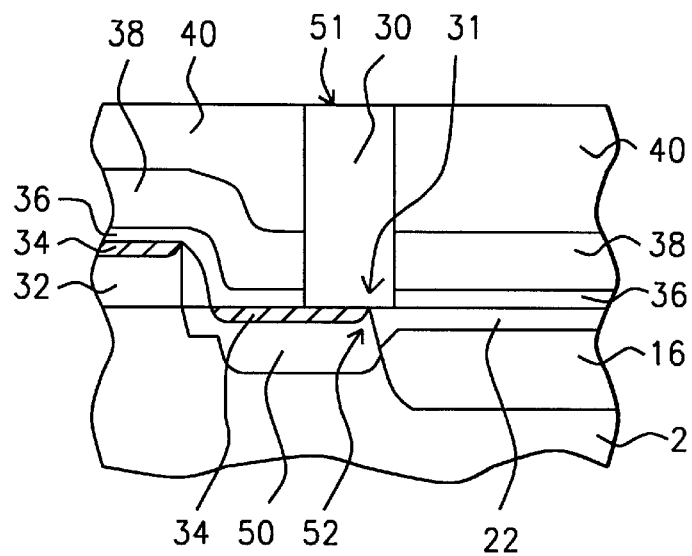
FIG. 6, which in cross-sectional representaion illustrates the method of an embodiment of the present invention, whereby an MOSFET device source/drain is electrically contacted using a borderless or "unframed" contact hole with a passivating nitride trench cap.

Referring to FIG. 6, contact hole formation 30 is sketched and several advantages of the method are shown. Note that the contact hole 30 misaligned and that the edge of the isolation trench 31 is protected by the passivating nitride cap 22. However, prior to the tungsten contact or plug/stud formation 30, several standard processes are performed: (a) thin gate thermal oxide formation, (not shown in Figs.), (b) polysilicon deposition, doping, anneal and patterning to form poly gates 32, (c) poly gate sidewall spacer 33 processes, (d) ion implantation and diffusion processes for source/drain 50, (e) titanium silicide 34 formation processes, (f) USG . . . undoped silicate glass 36 formation processes, depositing this film to about 1,000 Angstroms in thickness, (g) SACVD BPSG . . . sub-atmospheric chemical vapor deposition of boro phosphosilicate glass 38 . . . formation processes, depositing this film to about 5,000 Angstroms in thickness, (h) PE TEOS plasma enhanced TEOS tetraethylortho silicate deposited oxide 40 for planarization of the surface. Included are all the standard processes associated with providing these layers, which form an interlevel dielectric layer (ILD). Contact holes are defined and etched followed by CVD tungsten depositing. Tungsten plug/stud 51 formation results, as sketched in FIG. 6.

The contact hole (30) formation process, referred above in FIG. 6, uses special processing conditions to selectively etch the oxide and not etch the protecting cap silicon nitride layer 22. A plasma dry etching (RIE) process is utilized that selectively, preferentially removes oxide and stops on the nitride cap (22). The dry etch temperature is from about 80 to 200° C.

The following advantages of the present invention are brought about as a direct result of having the nitride cap in place and these are key embodiments of this invention. The nitride cap 22, as shown in FIG. 6, allow for a borderless contact to the silicide 34 topped diffusion region 50. Note the contact hole region 30 is deliberately shown to be misaligned to the source/drain diffusion region 50. The nitride cap 22 electrically insulates the edge of the contact region 52, as well as, acting or performing as an etch stop in a borderless contact hole etch process. Furthermore, the passivating nitride cap prevent "overgrowth" of the silicide process. In addition, the nitride cap achieves this borderless contact process without narrowing the poly to poly gate spacing, a key factor in achieving greater chip design densities and greater increases in chip performance. Another advantage to the nitride cap 22 is the elimination of the "keyhole formation" (not shown in Figs.), which results when an extra layer of silicon nitride is employed as a trench liner. The extra liner layer has the deleterious effect of reducing the poly to poly gate spacing and results in deleterious structures, termed "keyhole formation". The presence of "keyhole formation", found in high aspect ratio narrow and deep trenches, can have a long term reliability affect on devices. However, the use of the STI scheme described in the present invention, reduces the trench aspect ratio, which aids in trench filling, and in addition, eliminates the STI insulator seams and voids.

Further advantages of the nitride cap 22, FIG. 6, include protection of the STI oxide region from several processing effects. One obvious advantage to the nitride cap is the protection of the STI oxide from attack by etching processes that are occurring over these regions, for example, contact hole etching. Another prevention measure of the nitride cap 22 is, as shown in FIG. 6, the prevention of silicide 52 overgrowth due to excessive STI oxide recess. It can be seen from FIG. 6, that by insulating and protecting the edges of the field isolation from etch attack and silicide formation, the electrical junction leakage is minimized. This type of electrical leakage is termed "field edge intensive leakage" current. Hence, the cap nitride reduces the electrical leakage from the field isolation region, and thus, improves device reliability, a key enhancement brought about by this process. Also, key to this invention are the improvements in the process to fabricate borderless contacts, such as, improvements in the easy and simplicity of the process, improvements in the density of device design, and finally the improvements in the reliability of the devices.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a partially recessed shallow trench isolation structure on a semiconductor substrate, wherein a passivating trench cap is utilized to fabricate borderless contacts for MOSFET's, by the method comprising the following steps:

providing a semiconductor substrate, the semiconductor having a trench formed therein;

providing a pad oxide layer patterned on the surface of the semiconductor;

providing a hard mask layer patterned on the surface of the semiconductor;

filling the trench with a thick layer of insulator;

planarizing the insulator back to achieve a trench isolation region which is nearly planar with the hard mask layer;

etching the trench insulator back to approximately halfway to three-quarters of the way down into the trench;

etching and removing the hard mask layer by preferred selective etching while leaving the pad oxide in place;

depositing a thick layer of passivating insulator layer over the surface of the pad oxide and over the trench, filled with partially recessed insulation;

planarizing the thick layer of passivating insulator so that the trench isolation region with passivating insulator cap is nearly planar with the pad oxide;

oxidizing the semiconductor surface to form gate and capacitor oxide for MOSFET;

depositing, doping and patterning polysilicon gates;

providing gate sidewall isolation;

forming diffusion regions for MOSFET source/drains;

depositing and selectively forming salicide layers;

depositing and forming interlevel dielectric insulating layers;

patterning and etching contact holes to the source/drain P-N junction diffusion regions;

depositing by chemical vapor deposition (CVD) conductive contact metallurgy into the contact holes;

thus borderless or unframed contacts to source/drain in MOSFET's are fabricated with the use of said passivation cap layer in a partially recessed or semi-recessed trench isolation scheme, within a semiconductor substrate.

2. The method of claim 1, wherein passivating trench cap layer is deposited thick silicon nitride in a thickness from approximately 500 to 3,000 Angstroms.

3. The method of claim 1, comprising of the step of forming a P-N junction in the semiconductor substrate next to the sidewall of the trench, and wherein the prior step of forming a silicon nitride passivating trench cap layer, protects the P-N junction from the contact hole etching step.

4. A method of fabricating a partially recessed shallow trench isolation structure on a semiconductor substrate, wherein a passivating trench cap is utilized to fabricate borderless contacts for MOSFET's, by the method comprising the following steps:

providing a semiconductor substrate, single crystal silicon providing a trench formed therein;

providing a pad oxide layer of silicon dioxide patterned on the surface of the semiconductor;

providing a hard mask layer patterned on the surface of the semiconductor;

filling the trench with a thick layer of insulator;

planarizing the insulator back to achieve a trench isolation region which is nearly planar with the hard mask layer;

etching the trench insulator back to approximately halfway to three-quarters of the way down into the trench;

etching and removing the hard mask layer by preferred selective etching while leaving the pad oxide in place;

depositing a thick layer of passivating insulator layer over the surface of the pad oxide and over the trench, filled with partially recessed insulation;

planarizing the thick layer of passivating insulator so that the trench isolation region with passivating insulator cap is nearly planar with the pad oxide;

oxidizing the silicon surface to form thermal silicon dioxide for gate and capacitor insulator for MOSFET;

depositing, doping and patterning polysilicon gates;

providing gate sidewall isolation;

depositing and selectively forming salicide layers;

depositing and forming interlevel dielectric insulating layers;

patterning and etching contact holes to the source/drain P-N junction diffusion regions, with the silicon nitride trench cap layer protecting the corner region of the trench;

depositing by chemical vapor deposition (CVD) conductive contact metallurgy into the contact holes;

thus borderless or unframed contacts to source/drain in MOSFET's are fabricated with the use of said silicon nitride passivation cap layer in a partially recessed or semi-recessed silicon oxide trench isolation scheme, within a silicon semiconductor substrate.

5. The method of claim 4, wherein the process comprising of the formation of the passivating silicon nitride trench cap layer is compatible with complementary MOS (CMOS) transistors using both p- and n-type MOSFET gate channels.

* * * * *

UNITED STATES PATENT AND TRADEMARK OFFICE
CERTIFICATE OF CORRECTION

PATENT NO.    : 6,350,661 B2
DATED         : February 26, 2002
INVENTOR(S)   : Chong Wee Lim, Eng Hua Lim, Soh Yun Siah, Kong Hean Lee and Chun Hui Low It is certified that error appears in the above-identified patent and that said Letters Patent is hereby corrected as shown below:

<u>Title page,</u>
Item [75], delete "Chun Hui Low, Misia (MY)" and replace it with -- Chun Hui Low, Johor (MY) --.

Signed and Sealed this

Twenty-third Day of July, 2002

*Attest:*

*Attesting Officer*

JAMES E. ROGAN
*Director of the United States Patent and Trademark Office*